United States Patent [19]
Tsuchida et al.

[11] Patent Number: 5,558,719
[45] Date of Patent: Sep. 24, 1996

[54] PLASMA PROCESSING APPARATUS

[75] Inventors: Shinji Tsuchida, Tsuzuki-gun; Shigenori Ueda; Junichiro Hashizume, both of Nara, all of Japan

[73] Assignee: Canon Kabushiki Kaisha, Tokyo, Japan

[21] Appl. No.: 421,255

[22] Filed: Apr. 13, 1995

[30] Foreign Application Priority Data

Apr. 18, 1994 [JP] Japan .................................. 6-079013

[51] Int. Cl.$^6$ ............................................. C23C 16/00
[52] U.S. Cl. ................... 118/723 E; 118/723 R; 118/723 MP
[58] Field of Search ............... 118/723 MR, 723 MA, 118/723 MP, 723 E; 156/345; 204/298.34, 298.37; 315/111.81, 111.41, 111.31; 427/573, 588, 585

[56] References Cited

U.S. PATENT DOCUMENTS

| | | | |
|---|---|---|---|
| 4,631,105 | 12/1986 | Carroll et al. | 156/345 |
| 4,909,183 | 3/1990 | Kamiya et al. | 118/723 E |
| 4,958,591 | 9/1990 | Yamazaki | 118/723 E |
| 5,016,565 | 5/1991 | Saitoh et al. | 118/723 MP |
| 5,129,359 | 7/1992 | Takei et al. | 118/723 MP |
| 5,272,417 | 12/1993 | Ohmi | 315/111.21 |
| 5,383,984 | 1/1995 | Shimada et al. | 156/345 |
| 5,399,830 | 3/1995 | Maruyama | 219/121.43 |
| 5,433,790 | 7/1995 | Niino et al. | 118/723 MP |
| 5,439,715 | 8/1995 | Okamura | 118/723 E |
| 5,460,707 | 10/1995 | Wellerdieck | 204/298.08 |

FOREIGN PATENT DOCUMENTS

0578010A1  1/1994  European Pat. Off. .

OTHER PUBLICATIONS

H. Curtins, et al., "Influence of Plasma Excitation Frequency for a–Si:H Thin Film Deposition", Plasma Chemistry and Plasma Processing, vol. 7, 1987, (pp. 267–273).

Patent Abstracts of Japan, vol. 18, No. 290 (E–1557) Jun. 2, 1994.

Database WPI, Section Ch, Week 9509, Derwent Publications, Class L03, AN–95–064506.

*Primary Examiner*—R. Bruce Breneman
*Assistant Examiner*—Joni Y. Chang
*Attorney, Agent, or Firm*—Fitzpatrick, Cella, Harper & Scinto

[57] ABSTRACT

A plasma processing apparatus has a cathode electrode surrounding a target film formation base set in a deposition apparatus capable of pressure reduction and arranged parallel to the target film formation base. In the plasma processing apparatus, a plasma is generated between the cathode electrode and the target film formation base by applying an RF power having a discharge frequency of 20 MHz to 450 MHz to the cathode electrode. In the plasma processing apparatus, the cathode electrode is constituted by one metal material portion and at least two dielectric portions arranged at positions to sandwich the metal material portion, and a ratio ($L_1/L_2$) of a size ($L_1$) of the metal material portion of the cathode electrode in an axial direction to a size ($L_2$) of the target film formation base in the axial direction falls within a range of 0.1 to 0.45. With the plasma processing apparatus, instability and nonuniformity in plasma discharge are prevented to eliminate nonuniformity in film thickness and film quality, and a film having good characteristics is formed on a relatively large target film formation base at a high deposition speed to realize efficiency of productivity and a decrease in cost.

7 Claims, 6 Drawing Sheets

PLASMA PROCESSING APPARATUS

BACKGROUND OF THE INVENTION

1. Field of the Invention

The present invention relates to a plasma processing apparatus and, more specifically, a plasma processing apparatus for processing a base using a plasma as an excitation source, which serves as a plasma CVD apparatus capable of suitably forming a crystalline or nonmonocrystalline functional deposition film available for a semiconductor device, an electrophotographic photosensitive device, an image input line sensor, an image pickup device, a photovoltaic device, and the like, a sputtering apparatus capable of suitably forming an insulating film, a metal wiring film, and the like for a semiconductor device or an optical element, and an etching apparatus for a semiconductor device, and in which an RF wave of 20 MHz to 450 MHz can be suitably used.

2. Related Background Art

Various types of plasma processing apparatuses are used for semiconductors and the like in accordance with different application purposes. For example, a variety of apparatuses and methods have been used to enhance their features in, e.g., film formation of an oxide film, a nitride film, and an amorphous silicon-based semiconductor film using a plasma CVD apparatus and method, formation of a metal wiring layer using a sputtering apparatus and method, and micropatterning techniques using an etching apparatus and method.

Strong demand has recently arisen for improving the film quality and processing ability in a plasma processing method, and various implementations therefor have been examined.

Particularly, a plasma process with an RF power is used because it has advantages in stable electric discharge and thus formation of an insulating material such as an oxide film or a nitride film.

The oscillation frequency of a discharge RF power supply used for a conventional plasma process such as a plasma CVD process is generally 13.56 MHz. FIG. 1 is a schematic view for explaining the arrangement of a general plasma CVD apparatus frequently used in deposition film formation. The plasma CVD apparatus shown in FIG. 1 is an example of a film forming apparatus used when an amorphous silicon film (to be referred to as an a-Si film hereinafter) is to be formed on a cylindrical electrophotographic photosensitive body. A method of forming an a-Si film using this apparatus will be exemplified below.

In a reaction vessel 301 capable of pressure reduction, a cylindrical cathode electrode 302 electrically insulated from the reaction vessel 301 by an insulating material 311, and a cylindrical target film formation base (electrophotographic photosensitive base) 303 as a counter electrode are arranged. In order to improve uniformity in film thickness and film characteristics, the size of the cathode electrode 302 in the axial direction of a cylinder is larger than that of the target film formation base in the axial direction of the cylinder. For example, in order to reduce unevenness of a film thickness and obtain practically available uniformity in film thickness, the size of a cathode electrode in the axial direction of the cylinder must be at least about 1.5 to 2 times that of a target film formation base in the axial direction of the cylinder. Therefore, in the plasma CVD apparatus shown in FIG. 1, a relationship between the lengths of the target film formation base 303 and the cathode electrode 302 is kept so as to establish the above relationship (note that FIG. 1 does not accurately show this relationship). The target film formation base 303 is held by a rotation mechanism 304 driven by a motor M, and its interior is heated by an internal heater 305. An earth shield 306 is arranged around the cathode electrode 302 so as not to cause electric discharge between the cathode electrode 302 and the reaction vessel 301. An RF power supply 307 is connected to the cathode electrode 302 via a matching circuit 308. An evacuation means 309 and a gas supply means 310 are also provided.

After the interior of the reaction vessel 301 is evacuated to a predetermined vacuum degree (e.g., 1 mTorr or less) by the evacuation means 309, a source gas such as a silane gas, a disilane gas, a methane gas, or an ethane gas, or a doping gas such as a diborane gas is introduced by the gas supply means 310 to keep the interior of the reaction vessel 301 at several 10 mTorr to several Torr.

An RF power of 13.56 MHz is applied from the RF power supply 307 to the cathode electrode 302 to generate a plasma between the cathode electrode 302 and the target film formation base 303. The source gas is decomposed to deposit an a-Si film on the target film formation base 303 heated to about 100° C. to 400° C. by the heater 305.

Assume that a deposition speed for obtaining an a-Si film enough to satisfy to the performance of an electrophotographic photosensitive body according to this film forming method is set to form the a-Si film at a deposition speed of, e.g., about 6 μm/h. If the deposition speed is further increased, no satisfactory characteristics of the electrophotographic photosensitive body may be obtained. When an a-Si film is utilized as a general electrophotographic photosensitive body, a film thickness of at least 20 to 30 μm is required to obtain a satisfactory charging ability. For this reason, it takes a long period of time to manufacture an electrophotographic photosensitive body.

In recent years, a plasma CVD method using an RF power supply of 13.56 MHz or more in a parallel-plate plasma CVD apparatus is reported (Plasma Chemistry and Plasma Processing, Vol. 7, No. 3, (1987) PP. 267–273). This report suggests that the deposition speed can be increased by increasing a discharge frequency to more than 13.56 MHz without degrading the performance of a deposition film, which has received a great deal of attention. A sputtering method and the like using an increased discharge frequency are also reported. Recently, superiority of the increase in discharge frequency over other factors has been widely examined.

At the conventional discharge frequency of 13.56 MHz, the inductance of a cathode electrode can be ignored. However, when the discharge frequency is set at 20 MHz to 450 MHz, the inductance cannot be ignored. A plasma reaction is localized due to this inductance, so that it is difficult to uniform the discharge strength near a target film formation base on the entire target film formation base.

Such instability and nonuniformity in discharge strength cause nonuniformity in film thickness and film quality. In a film having structure-sensitive semiconductor properties, such as amorphous silicon used as an electrophotographic photosensitive body, optical and physical changes extremely sensitively appear on the film. For this reason, image degradation such as an image defect and unevenness of the density may be caused on a copied image.

When an electrophotographic photosensitive body as of amorphous silicon iS manufactured at a discharge frequency of 20 MHz to 450 MHz, the deposition speed is increased in comparison with a case using a discharge frequency of 13.56

MHz, but no great improvement in deposition speed has been attained. There is much room left unsolved for efficiency of productivity of products and a decrease in cost.

SUMMARY OF THE INVENTION

It is an object of the present invention to provide a plasma processing apparatus in which instability and nonuniformity in plasma discharge are prevented to eliminate nonuniformity in film thickness and film quality, and a film having good characteristics is formed on a relatively large target film formation base at a high deposition speed to realize efficiency of productivity and a decrease in cost.

It is another object of the present invention to provide a coaxial plasma processing apparatus, having a cathode electrode surrounding a target film formation base set in a deposition apparatus capable of pressure reduction and arranged parallel to the target film formation base, in which a plasma is generated between the cathode electrode and the target film formation base by applying an RF power having a discharge frequency of 20 MHz to 450 MHz to the cathode electrode, wherein the cathode electrode is constituted by one metal material portion and at least two dielectric portions arranged at positions to sandwich the metal material portion, and a ratio ($L_1/L_2$) of a size ($L_1$) of the metal material portion of the cathode electrode in an axial direction to a size ($L_2$) of the target film formation base in the axial direction falls within a range of 0.1 to 0.45.

DESCRIPTION OF THE PREFERRED EMBODIMENTS

The present inventors used a conventional plasma CVD apparatus, and performed an examination by applying an RF power of 20 MHz to 450 MHz obtained by increasing a conventional discharge frequency of 13.56 MHz. As a result, the present inventors found instability and nonuniformity in electric discharge, i.e., localization of a plasma, which did not occur in a case using a conventional discharge frequency of 13.56 MHz.

To get a clue to the solution, the present inventors considered the cause of the above problem as follows.

Assume that the impedance of a cathode electrode is represented by Z; the skin resistance of the cathode electrode, R; the inductance, L; the angular frequency of a frequency, $\omega$; and an imaginary unit, j. The impedance Z is represented by $$Z = R + j\omega L.$$

When the discharge frequency is conventionally 13.56 MHz, the inductance L can be ignored. As the discharge frequency is increased, the inductance L cannot be ignored, and the impedance Z of the cathode electrode is increased. As an RF voltage travels from an RF wave introduction portion onto the cathode electrode, the RF voltage tends to attenuate on the cathode electrode. This unevenness of the RF voltage causes localization of a plasma.

The present inventors attempted to suppress the localization of a plasma by decreasing a ratio ($L_1/L_2$) of the size ($L_1$) of a metal material of the cathode electrode in an axial direction of a cylinder to the size ($L_2$) of a target film formation base in the axial direction of the cylinder to about 1.5 to 2 times smaller than that obtained when the discharge frequency is conventionally 13.56 MHz, and thus decreasing the inductance L of the cathode electrode.

Figure 1:
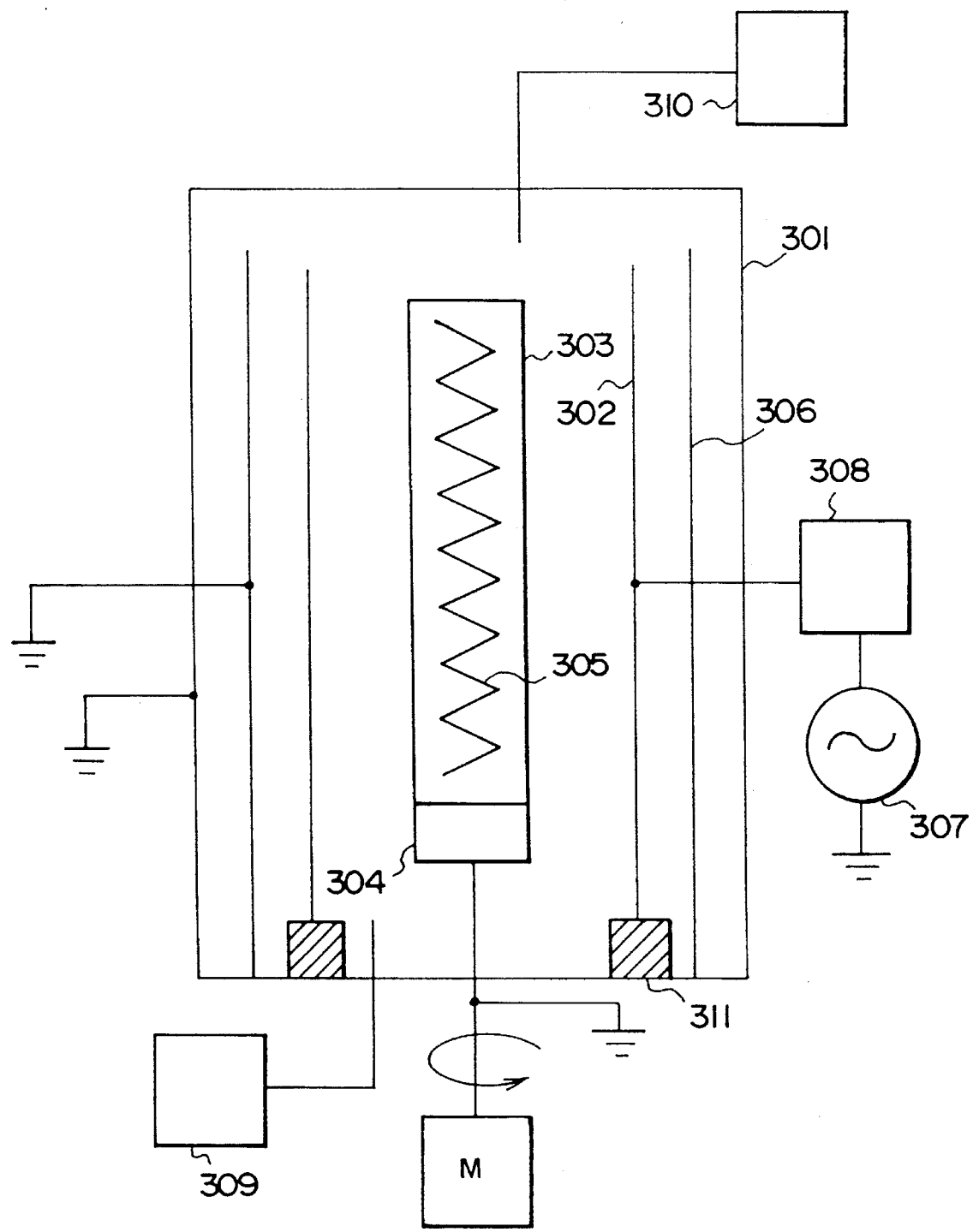
FIG. 1 is a schematic view for explaining an arrangement of a conventional plasma CVD apparatus.
Figure 2:
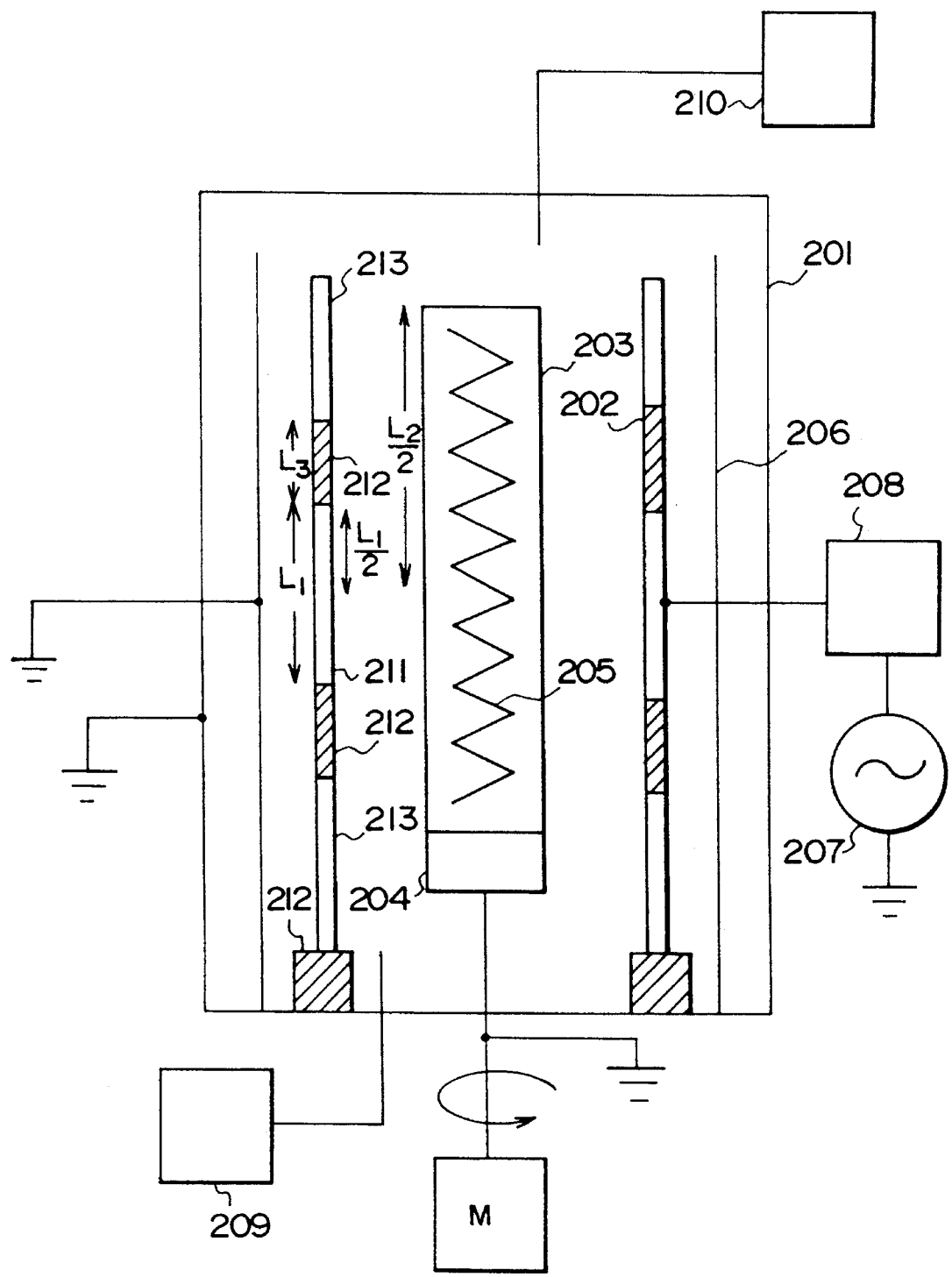
FIG. 2 is a schematic view for explaining the arrangement of a plasma CVD apparatus for an examination used in a comparative example of the present invention.

FIG. 2 shows an example of the apparatus.

A metal material portion 211 to which an RF power is applied, two metal material portions 213 to which no RF power is applied, and three dielectric members 212 are set as a cathode electrode in a reaction vessel 201 capable of pressure reduction. Further, a target film formation base 203 as a counter electrode is arranged in the reaction vessel 201. A size $L_1$ represents the size of the metal material portion 211 of the cathode electrode 202 to which an RF power is applied in a direction of height, and a size $L_2$ represents the size of the target film formation base 203 in the direction of height. The target film formation base 203 is held by a rotation mechanism 204 driven by a motor M, and its interior is heated by an internal heater 205. An RF power supply 207 is connected to the metal material portion 211 of the cathode electrode 202 via a matching circuit 208. An evacuation means 209, a gas supply means 210, and an outer shield 206 are provided.

When a film is to be formed, the target film formation base 203 is set in the reaction vessel 201, and the interior of the reaction vessel 201 is evacuated to a desired vacuum degree (e.g., 1 mTorr or less) by the evacuation means 209. Subsequently, the interior of the reaction vessel 201 is heated by the internal heater 205 to set the target film formation base 203 to a desired temperature within a range of about 100° C. to 400° C. Then, a predetermined amount of a source gas such as a silane gas, a disilane gas, a methane gas, or an ethane gas, or a doping gas such as a diborane gas is introduced by the gas supply means 210 to keep the interior of the reaction vessel 201 at a predetermined internal pressure by adjusting the evacuation means 209. When the gas is filled in the reaction vessel 201 at the predetermined internal pressure, an RF power of 20 MHz to 450 MHz is applied from the RF power supply 207 to the metal material portion 211 of the cathode electrode 202 via the matching circuit 208 to cause plasma discharge between the metal material portion 211 of the cathode electrode 202 and the target film formation base 203. The gas in the reaction vessel 201 is processed to generate a plasma, and a film is deposited on the target film formation base 203 for a predetermined period of time. Upon film formation for the predetermined period of time, the RF power supply 207 is turned off, and at the same time the introduction of the gas from the gas supply means 210 is stopped. Subsequently, the gas in the reaction vessel 201 is exhausted by the evacuation means 209. When a film is to be further formed, the same operation as described above may be repeated.

From the result of the examination, the ratio ($L_1/L_2$) of the size ($L_1$) of the metal material of the cathode electrode in the axial direction of the cylinder to the size ($L_2$) of the target film formation base in the axial direction of the cylinder was confirmed to set at 0.1 to 0.45 so as to obtain a practically preferable result of localization of plasma discharge caused by increasing the conventional discharge frequency of 13.56 MHz.

However, the following phenomenon was undesirably observed. That is, an RF power supplied to the metal material portion of the cathode electrode traveled to another metal material portion of the cathode electrode via a dielectric member to cause electric discharge between another metal material portion of the cathode electrode and the target film formation base in addition to traveling between the target film formation base and the metal material portion of the cathode electrode to which an RF power was supplied.

In order to solve this problem, the present inventors performed an examination based on the following viewpoint. That is, by using a dielectric member for the entire cathode electrode except for its metal material portion to which an RF power is supplied, electric discharge occurs only between the target film formation base and the metal material portion of the cathode electrode to which an RF power is supplied. No electric discharge occurs between the target film formation base and the remaining metal material portion except for the metal material portion of the cathode electrode to which an RF power is supplied, thereby increasing a film forming speed and improving film quality.

As a result, it is confirmed that, by using a dielectric member for the cathode member except for its metal material portion to which an RF power is supplied, the film forming speed is increased, and unevenness of a film thickness is reduced to improve the film quality.

Figure 3:
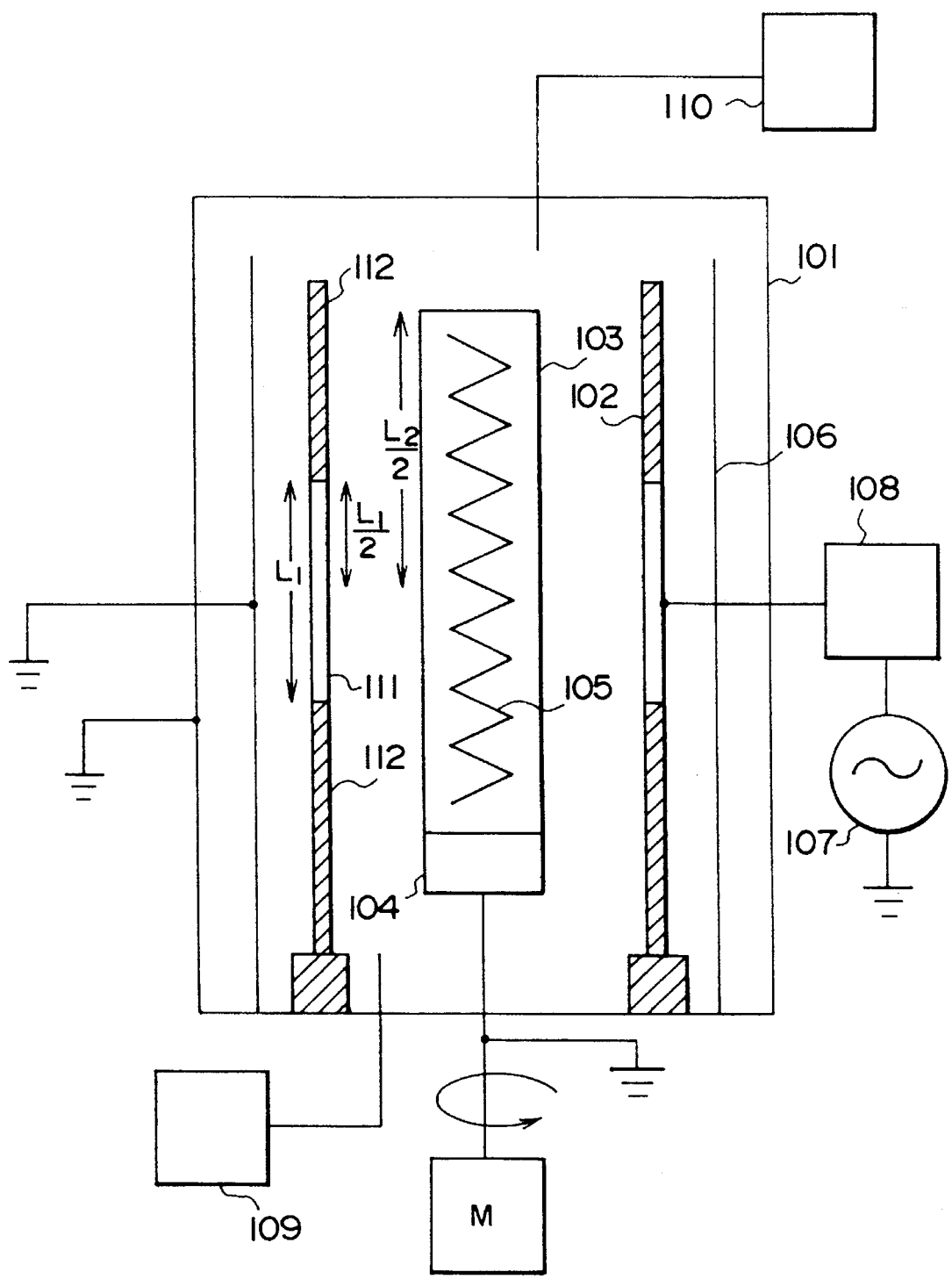
FIG. 3 is a schematic view for explaining an arrangement of a plasma CVD apparatus of the present invention.

FIG. 3 shows an example of the apparatus, and a film forming method using the apparatus will be described below.

In a reaction vessel 101 capable of pressure reduction, a metal material portion 111 as part of a cathode electrode 102 which is electrically insulated from the reaction vessel 101 by two dielectric members 112, and a target film formation base 103 as a counter electrode are arranged. A size $L_1$ represents the size of the metal material portion 111 of the cathode electrode 102 in a direction of height, and a size $L_2$ represents the size of the target film formation base 10 103 in the direction of height. The target film formation base 103 is held by a rotation mechanism 104 driven by a motor M, and its interior is heated by an internal heater 105. An RF power supply 107 is connected to the metal material portion 111 of the cathode electrode 102 via a matching circuit 108. An evacuation means 109, a gas supply means 110, and an outer shield 106 are provided.

The target film formation base 103 of the present invention can have a material and shape in accordance with an application purpose. For example, as for its shape, when the target film formation base 103 is used for an electrophotographic photosensitive body, it is preferable that the outer surface of the photosensitive body be electrically conductive, and the shape be cylindrical. However, the shape may be a planar or another shape, as needed. Examples of its material are copper, aluminum, gold, silver, platinum, lead, nickel, cobalt, iron, chromium, molybdenum, titanium, stainless steel, and a composite material of two or more types of the above materials. In addition, the target film formation base 103 can be constituted by covering a conductive material on an insulating material such as polyester, polyethylene, polycarbonate, cellulose, acetate, polypropylene, polyvinyl chloride, polyvinylidene chloride, polystyrene, glass, ceramics, or a paper sheet. The above insulating materials and metal materials can be used for the target film formation base.

Preferable examples of the metal material portion 111 of the cathode electrode 102 are copper, aluminum, gold, silver, platinum, lead, nickel, cobalt, iron, chromium, molybdenum, titanium, and stainless steel, and a composite material of two or more types of the above materials. If the target film formation base is cylindrical, the shape of the cathode electrode 102 is preferably cylindrical. As far as the cathode electrode 102 is substantially parallel to the target film formation base, it may be an elliptical or polygonal shape, as needed. The central axis of the cathode electrode 102 is preferably set to coincide with that of the target film formation base to arrange the cathode electrode 102 coaxial (concentric) with the target film formation base. A cooling means may be provided for the metal material portion 111 of the cathode electrode 102, as needed. Cooling is performed by using a cooling means such as water, air, liquid nitrogen, a Peltier element, as needed.

Examples of the material of each dielectric member 112 are alumina ceramics, ethylene tetrafluoride, quartz glass, borosilicate glass, and any insulating material containing one or a plurality of element oxides of aluminum oxide, magnesium oxide, and silicon oxide as a main component. The shape of each dielectric member 112 is preferably cylindrical, but is not limited to this.

The target film formation base 103 is set in the reaction vessel 101, and the interior of the reaction vessel 101 is evacuated to a desired vacuum degree (e.g., 1 mTorr or less) by the evacuation means 109. Subsequently, the interior of the reaction vessel 101 is heated by the internal heater 105 to set the target film formation base 103 to a desired temperature within a range of about 100° C. to 400° C. Then, a predetermined amount of a source gas such as a silane gas, a disilane gas, a methane gas, or an ethane gas, or a doping gas such as a diborane gas is introduced by the gas supply means 110 to keep the interior of the reaction vessel 101 at a predetermined internal pressure by adjusting the evacuation means 109. When the gas is filled in the reaction vessel 101 at the predetermined internal pressure, an RF power of 20 MHz to 450 MHz is applied from the RF power supply 107 to the metal material portion 111 of the cathode electrode 102 via the matching circuit 108 to cause plasma discharge between the metal material portion 111 of the cathode electrode 102 and the target film formation base 103. The gas in the reaction vessel 101 is processed to generate a plasma, and a film is deposited on the target film formation base 103 for a predetermined period of time. Upon film formation for the predetermined period of time, the RF power supply 107 is turned off, and at the same time the introduction of the gas from the gas supply means 110 is stopped. Subsequently, the gas in the reaction vessel 101 is exhausted by the evacuation means 109. When a film is to be further formed, the same operation as described above may be repeated.

Detailed examples for exemplifying the effect of the present invention will be described below. The present invention is not limited to the detailed examples.

EXAMPLE 1

In the deposition film forming apparatus shown in FIG. 3, a plasma was generated between the aluminum metal material portion 111 and the aluminum target film formation base 103 by using the RF power supply 107 of a discharge frequency of 105 MHz. A ratio ($L_1/L_2$) of the size ($L_1$) of the metal material portion 111 as part of the cathode electrode 102 in the axial direction of the cylinder to the size ($L_2$) of the aluminum target film formation base 103 in the axial direction of the cylinder was set at 0.3. A point at ½ the size $L_1$ and a point at ½ the size $L_2$ were set at almost the same position in the axial direction of the cylinder. Film formation was performed using the two alumina ceramic dielectric members 112 under conditions shown in Table 1. Furthermore, a groove was formed in the target film formation base 103, a glass substrate (7059 available from Corning) was set in the formed groove, and a deposition film was formed on this glass substrate under the same conditions as shown in Table 1.

TABLE 1

| | |
|---|---|
| Gas Flow Rate | $SiH_4$: 400 sccm, $H_2$: 400 sccm |
| Pressure | 20 mTorr |
| Discharge Power | 500 W |
| Temperature of Target Film Formation Base | 310° C. |

Comparative Example 1

The deposition film forming apparatus shown in FIG. 2 comprised the two aluminum metal material portions 213 to which no RF power was applied from the RF power supply 207, and the three alumina ceramic dielectric members 212. In this apparatus, a plasma was generated between the aluminum metal material portion 211 and the aluminum target film formation base 203 by using the RF power supply 207 of a discharge frequency of 105 MHz. The ratio ($L_1/L_2$) of the size ($L_1$) of the metal material portion 211 of the cathode electrode 202 in the axial direction of the cylinder to the size ($L_2$) of the target film formation base 203 in the axial direction of the cylinder was set at 0.3. A point at ½ the size $L_1$ and a point at ½ the size $L_2$ were set at almost the same position in the axial direction of the cylinder. Film formation was performed under conditions shown in Table 1. Furthermore, a groove was formed in the target film formation base 203, a glass substrate (7059 available from Corning) was set in the formed groove, and a deposition film was formed on this glass substrate under the same conditions as shown in Table 1.

As a result, the film forming speed of Example 1 was 1.6 times higher than that of Comparative Example 1. Note that the film forming speed was obtained as follows. The thicknesses of a film deposited on the target film formation base were measured at 30 portions in each of the circumferential and axial directions of the cylinder by an eddy current film thickness meter (available from Kett Scientific Laboratory) to calculate the average film thickness. The film forming speed was obtained from the calculated average film thickness and its deposition time.

From this result, the film forming speed was increased by using an induction member for the entire cathode electrode except for its metal material portion to which an RF power was supplied, and more preferable results were obtained in terms of practical applications.

Further, a Cr gap electrode was deposited in a vacuum on the 7059 glass on which the deposition film was formed. A light conductivity ratio and a dark conductivity ratio were measured by a micro-current meter (4140B available from YHP). As a light source for the light conductivity ratio, a 7-mW helium-neon laser was used. As a result of comparison between a light-dark conductivity ratio (light conductivity ratio/dark conductivity ratio) in Example 1 and that in Comparative Example 1, the light-dark conductivity ratio in Example 1 was 2.9 times higher than that in Comparative Example 1. From this result, more preferable results were obtained by using the induction member for the entire cathode electrode except for its metal material portion to which an RF power was supplied.

From the above results, it is proved that a good deposition film can be obtained by the plasma processing apparatus according to the present invention.

EXAMPLE 2

In Example 2, films were formed on aluminum target film formation bases 103 and glass substrates under the same conditions as in Example 1 except that the ratio $L_1/L_2$ was changed to 0.05, 0.1, 0.2, 0.4, 0.45, 0.5, and 0.6.

Figure 4:
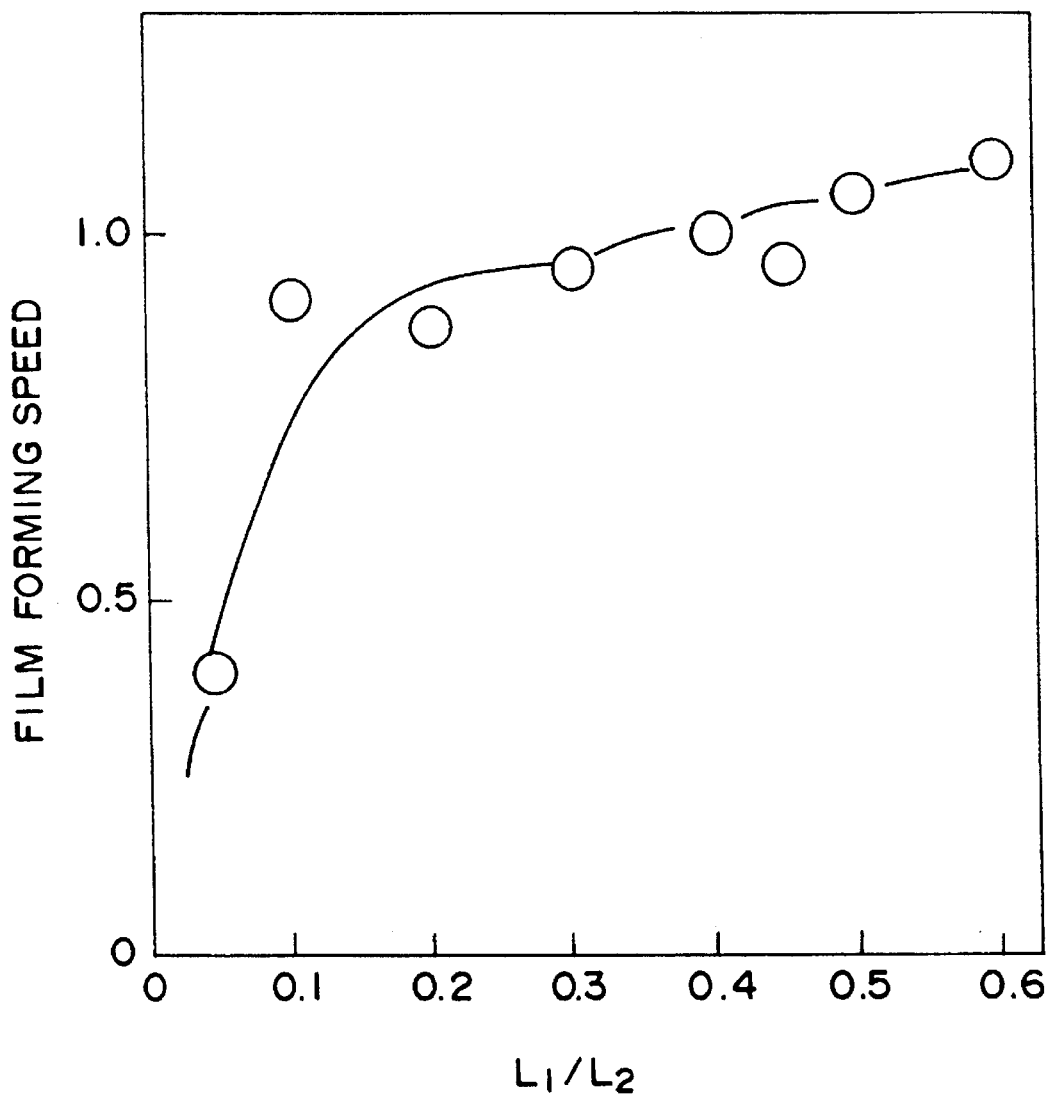
FIG. 4 is a graph for explaining a relationship between an $L_1/L_2$ and a film forming speed.

FIG. 4 shows the results of a film forming speed with respect to values $L_1/L_2$. The film forming speed was obtained in the same manner as in Example 1. The ordinate represents the film forming speed, and the abscissa represents the ratio ($L_1/L_2$) of the size ($L_1$) of the metal material portion of the cathode electrode in the axial direction of the cylinder to the size ($L_2$) of the target film formation base in the axial direction of the cylinder. The film forming speed is represented by a relative value when the film forming speed at $L_1/L_2=0.4$ is set at 1.0. As the value is larger, the film forming speed is higher.

Figure 5:
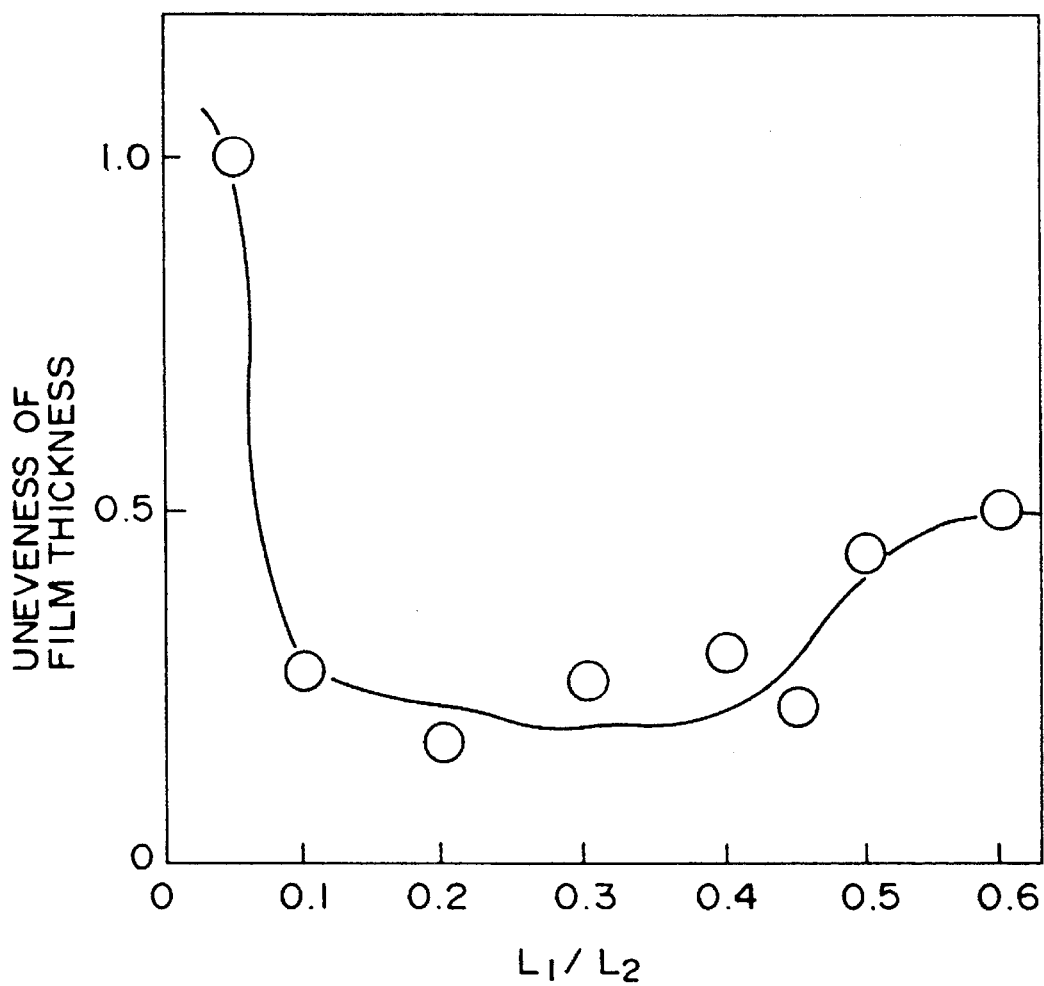
FIG. 5 is a graph for explaining a relationship between the $L_1/L_2$ and unevenness of a film thickness.

FIG. 5 shows the results of unevenness of a film thickness with respect to values $L_1/L_2$. Note that the unevenness of a film thickness represents results obtained as follows. The thicknesses of a film deposited on the target film formation base were measured at 30 portions in each of the circumferential and axial directions of the cylinder by an eddy current film thickness meter (available from Kett Scientific Laboratory) to calculate the standard deviation. The ordinate represents the unevenness of a film thickness, and the abscissa represents the ratio ($L_1/L_2$) of the size ($L_1$) of the metal material portion of the cathode electrode in the axial direction of the cylinder to the size ($L_2$) of the target film formation base in the axial direction of the cylinder. The unevenness of a film thickness is represented by a relative value when the unevenness of a film thickness at $L_1/L_2=0.05$ is set at 1.0. As the value is smaller, the unevenness of a film thickness is smaller.

Figure 6:
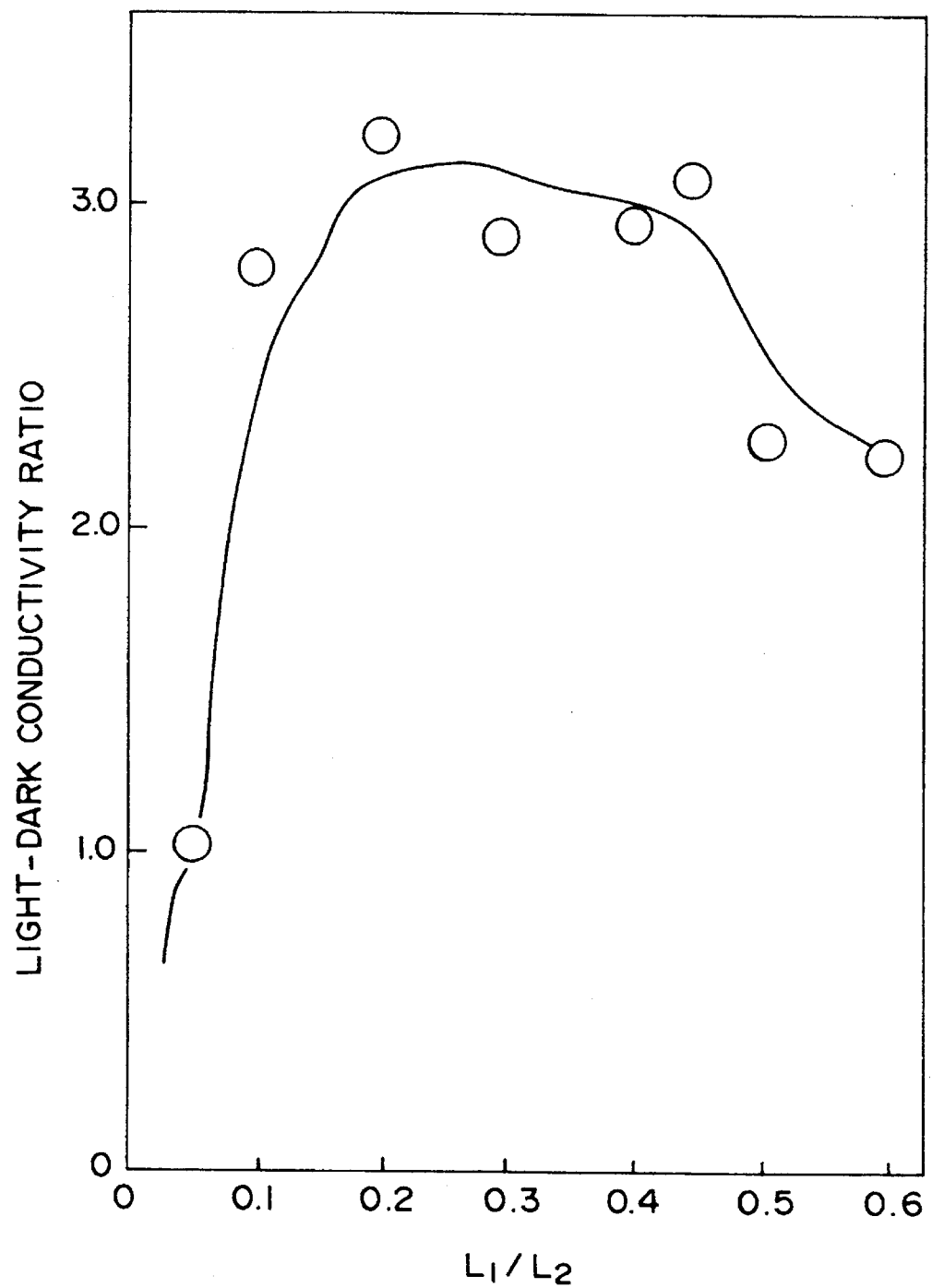
FIG. 6 is a graph for explaining a relationship between the $L_1/L_2$ and a light-dark conductivity ratio.

FIG. 6 shows the results of a light-dark conductivity ratio with respect to values $L_1/L_2$. The light-dark conductivity ratio was measured in the same manner as in Example 1, and its value is represented by a relative value when the light-dark conductivity ratio at $L_1/L_2=0.05$ is set at 1.0. It indicates that, as the value is larger, a film having excellent semiconductor characteristics in which changes in light and dark conductivity ratios are large is obtained.

From the above-mentioned results shown in FIGS. 4, 5, and 6, it is clear that more preferable results can be obtained in terms of practical applications by allowing the ratio ($L_1/L_2$) of the size ($L_1$) of the metal material of the cathode electrode in the axial direction of the cylinder to the size ($L_2$) of the target film formation base in the axial direction of the cylinder to fall within a range of 0.1 to 0.45.

From the above results, it is proved that a good deposition film can be obtained by the plasma CVD deposition film forming apparatus and the processing method according to the present invention.

EXAMPLE 3

In Example 3, films were formed on aluminum target film formation bases 103 and glass substrates under the same conditions as in Example 1 and film formation conditions shown in Table 2 except that the ratio $L_1/L_2$ in Example 1 was set at 0.4, and as a material of the two dielectric members 112, alumina ceramics, quartz glass, Teflon, borosilicate glass, aluminum oxide, magnesium oxide, silicon oxide, a material containing aluminum oxide and magnesium oxide at a molar ratio of 1:1, a material containing magnesium oxide and silicon oxide at a molar ratio of 1:1, and a material containing aluminum oxide, silicon oxide, and magnesium oxide at a molar ratio of 1:1:1 were used.

TABLE 2

| Gas Flow Rate | $SiH_4$: 400 sccm, $H_2$: 400 sccm |
|---|---|
| Pressure | 20 mTorr |
| Discharge Power | 200 W |
| Temperature of Target Film Formation Base | 310° C. |

Unevenness of the thicknesses of films formed on the target film formation bases and the glass substrates, a film forming speed, and a light-dark conductivity ratio were measured in the same manner as in Example 2 to obtain preferable results as in the case of $L_1/L_2=0.4$ in Example 2.

From the above results, it is proved that a good deposition film can be obtained by the plasma CVD deposition film forming apparatus and the processing method according to the present invention.

EXAMPLE 4

In Example 4, films were formed on aluminum target film formation bases 103 and glass substrates under the same conditions as in Example 1 except that the discharge frequency was changed to 20 MHz, 50 MHz, 150 MHz, 300 MHz, and 450 MHz.

Unevenness of the thicknesses of films formed on the target film formation bases and the glass substrates, a film forming speed, and a light-dark conductivity ratio were measured in the same manner as in Example 1 to obtain preferable results as in Example 1 at any frequency.

From the above results, it is proved that a good deposition film can be obtained by the plasma CVD deposition film forming apparatus and the processing method according to the present invention.

EXAMPLE 5

In Example 5, a lower blocking layer, a photoconductive layer, and a surface protection layer were formed in this order on the aluminum target film formation base 103 under the same conditions as in Example 1 and conditions shown in Table 3, thereby manufacturing an amorphous silicon electrophotographic photosensitive drum. The temperature of the target film formation base was 310° C. during the manufacture.

TABLE 3

| Lower Blocking Layer | $SiH_4$ | 300 sccm |
|---|---|---|
| | $H_2$ | 500 sccm |
| | NO | 8 sccm |
| | $B_2H_6$ | 2,000 ppm (to flow rate of $SiH_4$) |
| | Pressure | 200 mTorr |
| | Discharge power | 400 W |
| | Film thickness | 1 μm |
| Photoconductive Layer | $SiH_4$ | 500 sccm |
| | $H_2$ | 500 sccm |
| | Pressure | 500 mTorr |
| | Discharge power | 600 W |
| | Film thickness | 20 μm |

TABLE 3-continued

| Surface Protection Layer | $SiH_4$ | 500 sccm |
|---|---|---|
| | $CH_4$ | 500 sccm |
| | Pressure | 400 mTorr |
| | Discharge power | 100 W |
| | Film thickness | 1 μm |

An image was evaluated by mounting the drum manufactured in Example 5 into a copying machine NP7550 available from CANON INC. which was modified for an experiment, thereby obtaining a high quality image without unevenness of the image and an image memory.

From the above results, it is proved that a good amorphous silicon electrophotographic photosensitive drum can be obtained by the plasma CVD deposition film forming apparatus and the processing method according to the present invention.

EXAMPLE 6

In Example 6, a charge transport layer, a charge generation layer, and a surface protection layer were formed in this order on the aluminum target film formation base 103 under the same conditions as in Example 1 and conditions shown in Table 4, thereby manufacturing an amorphous silicon electrophotographic photosensitive drum of a function separation type. The temperature of the target film formation base was 310° C. during the manufacture.

TABLE 4

| Charge Transport Layer | $SiH_4$ | 100 sccm |
|---|---|---|
| | $H_2$ | 300 sccm |
| | $CH_4$ | 200 sccm |
| | $B_2H_6$ | 10 ppm (to flow rate of $SiH_4$) |
| | Pressure | 300 mTorr |
| | Discharge power | 500 W |
| | Film thickness | 15 μm |
| Charge Generation Layer | $SiH_4$ | 300 sccm |
| | $H_2$ | 500 sccm |
| | Pressure | 500 mTorr |
| | Discharge power | 400 W |
| | Film thickness | 2 μm |
| Surface Protection Layer | $SiH_4$ | 200 sccm |
| | $CH_4$ | 500 sccm |
| | Pressure | 400 mTorr |
| | Discharge power | 150 W |
| | Film thickness | 0.5 μm |

An image was evaluated by mounted the drum manufactured in Example 6 into a copying machine NP7550 available from CANON INC. which was modified for an experiment, thereby obtaining a high quality image without unevenness of the image and an image memory.

From the above results, it is proved that a good amorphous silicon electrophotographic photosensitive drum can be obtained by the plasma CVD deposition film forming apparatus and the processing method according to the present invention.

As has been described above, the plasma processing apparatus of the present invention can stably form a film having good characteristics on a relatively large target film formation base at a very high deposition speed, thereby realizing efficiency of productivity and a decrease in cost.

What is claimed is:

1. A plasma processing apparatus, having a cathode electrode surrounding a target film formation base set in a deposition apparatus capable of pressure reduction and arranged parallel to said target film formation base, in which a plasma is generated between said cathode electrode and said target film formation base by applying an RF power having a discharge frequency of 20 MHz to 450 MHz to said cathode electrode, wherein said cathode electrode is constituted by one metal material portion and at least two dielectric portions arranged at positions to sandwich said metal material portion, and a ratio ($L_1/L_2$) of a size ($L_1$) of said metal material portion of said cathode electrode in an axial direction to a size ($L_2$) of said target film formation base in the axial direction falls within a range of 0.1 to 0.45.

2. An apparatus according to claim 1, wherein said plasma processing apparatus is a plasma CVD apparatus.

3. An apparatus according to claim 1, wherein said dielectric portions consist of at least one material selected from the group consisting of alumina ceramics, Teflon, quartz glass, and borosilicate glass.

4. An apparatus according to claim 1, wherein said dielectric portions consist of at least one element oxide selected from the group consisting of aluminum oxide, magnesium oxide, and silicon oxide as a main component.

5. An apparatus according to claim 1, wherein said cathode electrode is cylindrical, and an axis of said cathode electrode is coaxial with said set target film formation base, and said target film formation base is cylindrical.

6. An apparatus according to claim 5, wherein a position of a center of the size ($L_1$) of said metal material portion of said cathode electrode in the axial direction is the same as a position of a center of the size ($L_2$) of said target film formation base in the axial direction.

7. An apparatus according to claim 1, wherein the axial direction is an axial direction of a cylinder.

* * * * *

UNITED STATES PATENT AND TRADEMARK OFFICE
CERTIFICATE OF CORRECTION

PATENT NO. : 5,558,719

DATED : September 24, 1996

INVENTOR(S): SHINJI TSUCHIDA, ET AL.

It is certified that error appears in the above-identified patent and that said Letters Patent is hereby corrected as shown below:

[56] REFERENCES CITED

U.S. Patent Documents
"5,439,715 8/1995 Okamura" should read
--5,439,715 3/1995 Okamura--.

COLUMN 1

Line 13, "like," should read --like;--.
Line 16, "element," should read --element;--.
Line 27, "method," should read --method;--.
Line 28, "method," should read --method;--.
Line 36, "advantages in" should be deleted.
Line 38, "film." should read --film can be made uniformly.--
Line 43, "deposition" should read --deposited--.

COLUMN 2

Line 25, "enough" should be deleted
and "to" (second occurrence) should be deleted.
Line 27, "a deposition speed of," should be deleted.
Line 29, "no satisfactory characteristics of" should be deleted.
Line 30, "may be obtained." should read --may not have satisfactory characteristics.--.
Line 38, "is" should read --has been--.
Line 53, "uniform the" should read --achieve uniform--.
Line 59, "extremely" should be deleted.

UNITED STATES PATENT AND TRADEMARK OFFICE
CERTIFICATE OF CORRECTION

PATENT NO. : 5,558,719

DATED : September 24, 1996

INVENTOR(S): SHINJI TSUCHIDA, ET AL.

Page 2 of 4

It is certified that error appears in the above-identified patent and that said Letters Patent is hereby corrected as shown below:

COLUMN 2 (Cont.)

Line 61, "sensitively" should be deleted.
Line 62, "radation" should read --radation,--
   and "defect" should read --defect,--.
Line 63, "be caused" should read --occur--.
Line 64, "as" should be deleted.
Line 65, "iS" should read --is--.

COLUMN 3

Line 1, "in" should read --in film-- and "speed"
   should be deleted.
Line 2, "left unsolved for" should read --to improve
   production--.
Line 3, "of productivity of products and a" should
   be deleted.
Line 3, "decrease in cost." should read --and
   decrease cost.--.
Line 10, "and" should read --and provide--. (first occurrence
Line 11, "is formed" should be deleted.
Line 59, "To get a clue to the solution, the" should
   read --The--.

UNITED STATES PATENT AND TRADEMARK OFFICE
CERTIFICATE OF CORRECTION

PATENT NO. : 5,558,719

DATED : September 24, 1996

INVENTOR(S) : SHINJI TSUCHIDA, ET AL.

It is certified that error appears in the above-identified patent and that said Letters Patent is hereby corrected as shown below:

COLUMN 5

Line 5, "phenomenon was undesirably" should read --undesirable phenomenon was--.
Line 39, "base 10 103" should read --base 103--.
Line 49, "as for its shape," should be deleted.
Line 54, "a" should be deleted.

COLUMN 7

Line 6, "deposition" should read --deposited--.
Line 20, "deposition" should read --deposited--.

COLUMN 8

Line 3, "deposition" should read --deposited--.
Line 57, "deposition" should read --deposited--.

COLUMN 9

Line 23, "deposition" should read --deposited--.
Line 24, "deposition" should read --deposited--.
Line 39, "deposition" should read --deposited--.
Line 40, "deposition" should read --deposited--.

UNITED STATES PATENT AND TRADEMARK OFFICE
CERTIFICATE OF CORRECTION

PATENT NO. : 5,558,719

DATED : September 24, 1996

INVENTOR(S) : SHINJI TSUCHIDA, ET AL.

It is certified that error appears in the above-identified patent and that said Letters Patent is hereby corrected as shown below:

<u>COLUMN 10</u>

```
Line 16, "deposition" should read --deposited--.
Line 48, "mounted" should read --mounting--.
Line 55, "deposition" should read --deposited--.
Line 63, "realizing" should read --realizing production--
    and "of productivity" should be deleted.
```

Signed and Sealed this

Twenty-first Day of October 1997

*Attest:*

BRUCE LEHMAN

*Attesting Officer*　　*Commissioner of Patents and Trademarks*